United States Patent [19]

Arts

[11] Patent Number: 5,452,310
[45] Date of Patent: Sep. 19, 1995

[54] METHOD OF AND DEVICE FOR CORRECTING ERRORS AND ERASURES IN DIGITAL INFORMATION

[75] Inventor: Petrus Arts, Eindhoven, Netherlands

[73] Assignee: U.S. Philips Corporation, New York, N.Y.

[21] Appl. No.: 126,839

[22] Filed: Sep. 24, 1993

[30] Foreign Application Priority Data

Oct. 9, 1992 [EP] European Pat. Off. ............ 92203104

[51] Int. Cl.6 ...................... G06F 11/10; H03M 13/00
[52] U.S. Cl. .................................. 371/37.1; 371/37.4; 371/38.1
[58] Field of Search .................... 371/37.1, 37.4, 37.5, 371/37.8, 40.1, 40.3

[56] References Cited

U.S. PATENT DOCUMENTS

| | | | |
|---|---|---|---|
| 4,675,869 | 6/1987 | Driessen | 371/37.8 |
| 4,928,288 | 5/1990 | D'Aria et al. | 371/37.5 |
| 5,206,864 | 4/1993 | McConnell | 371/37.4 |

OTHER PUBLICATIONS

"The Art of Digital Audio", J. Watkinson, Focal Press, London, 1988, chapter 7, pp. 201–247.
Philips Technical Review, vol. 40, 1982, No. 6, pp. 166–173.

Primary Examiner—Roy N. Envall, Jr.
Assistant Examiner—Emmanuel Moise

[57] ABSTRACT

A method for correcting symbol errors and a method for correcting symbol errors and symbol erasures in a code word composed of plural-bit symbols that has been encoded according to an error protection code with a predetermined symbol error correction capability. The method includes the following steps: (1) imposing an erasure indication for each symbol of a sub-set of the symbols; (2) executing a complete error correction operation by means of the imposed erasure(s); (3) verifying correctness of the error correction operation; and (4) repeating steps 1, 2 and 3 for different sub-sets until either the verifying indicates said correctness or until all relevant sub-sets have been subjected to steps 1, 2 and 3.

19 Claims, 1 Drawing Sheet

METHOD OF AND DEVICE FOR CORRECTING ERRORS AND ERASURES IN DIGITAL INFORMATION

BACKGROUND OF THE INVENTION

The invention relates to a method of correcting errors and erasures in digital information subdivided into code words in accordance with an error correction code with minimum distance d, which code words contain data symbols and redundant symbols, in theory it being possible to correct at the most Tmax errors, at the most T errors being corrected. The invention also relates to a device suitable for carrying out the method.

A method and device of the kind set forth are described in Philips Technical Review, Vol. 40, 1982, No. 6, pp. 166–173. Digital information representing, for example sound (sampled, quantized, coded and modulated audio signals) is subdivided into code words in conformity with an error correction code (for example, a Reed-Solomon code), which code words consist of data symbols (containing the actual information) and redundant symbols (added in accordance with the rules of the error correction code in order to enable error correction and detection). An incorrect symbol (i.e. a symbol to be corrected) whose position in the code word is known is referred to as an erasure. An incorrect symbol in a code word whose exact value and position in the code word are unknown, is referred to as an error. The term "error correction operation" may include the finding of the correct value of one or more erasure symbols. The error correction code used has a minimum distance, say d. In that case a number of t errors and a number of e erasures can be corrected per code word, provided that the equation $2t+e<d$ is satisfied. The largest number of errors that can be corrected in theory, say Tmax, equals $(d-1)/2$ for d odd and $(d-2)/2$ for d even. Therefore, $2\text{Tmax}=(d-1)-(d-1)\text{MODULO }2$. The method utilizes known means (the input being the code word and erasure data, i.e. the number and the positions of the erasures in the code word) for correcting at the most T errors, the value of T being smaller than or equal to Tmax. The complexity of the means used for correcting at the most T errors (the known erco circuit) is highly dependent on the value of T, because the magnitude and difficulty of the calculations to be performed are a sharply rising function of T. Therefore, the means become very complex for high values of T.

SUMMARY OF THE INVENTION

It is inter alia an object of the invention to provide a method of correcting at the most T errors while utilizing means (known per se) for correcting at the most T−1 errors. To this end, a method in accordance with the invention is characterized in that per code word the correction involves the following steps:

1. imposing an erasure indication for each symbol of a sub-set of the symbols;
2. executing a complete error correction operation by means of said imposed erasure(s);
3. verifying correctness of this complete error correction operation;
4. repeating the steps 1, 2 and 3 for different sub-sets until either said verifying indicates said correctness or until all relevant sub-sets have been subjected to the steps 1, 2 and 3.

Thus, by successively performing a correction for at the most T−1 errors, ultimately a correction for T errors will also be performed, without utilizing the customary, more complex erco circuit. This is attractive for applications of error correction codes where the most complex desired correction (T errors) occurs comparatively rarely and adequate correction time is available.

A device suitable for carrying out the method in accordance with the invention is characterized in that it comprises means for receiving a code word, means for receiving erasure data, means for correcting at the most T−1 errors, and means which are activated when the number of erasures is smaller than or equal to $2(\text{Tmax}-T)+(d-1)\text{MODULO }2$ and a first correction by means of the means for correcting at the most T−1 errors was not successful, in order to define successively each time at least 1 symbol of the code word as a fictitious erasure and to execute, given the erasures e and the fictitious erasure(s), a further correction by way of the means for correcting at the most T−1 errors until substantially all constituent symbols of the code word have had their turn. The invention thus provides a less complex device for correcting as many errors and erasures in digital information as known devices.

BRIEF DESCRIPTION OF THE DRAWINGS

The invention will be further described in accordance with the following drawings, in which.

DESCRIPTION OF THE PREFERRED EMBODIMENTS

Digital information representing, for example sound (sampled, quantized, encoded and modulated audio signals) can be subdivided, in conformity with an error correction code (for example, a Reed-Solomon code), into code words consisting of data symbols (containing the actual information) and redundant symbols (added in conformity with the rules of the error correction code so as to enable error correction and detection). An incorrect symbol (that is to say a symbol to be corrected) whose position in the code word is known is referred to as an erasure. An incorrect symbol whose value and position in the code word are unknown is referred to as an error. The error correction code used has a minimum distance, say d. In that case a number of t errors and a number of e erasures can be corrected per code word, provided that the equation $2t+e<d$ is satisfied. The largest number of errors that can be corrected in theory, say Tmax), equals $(d-1)/2$ for d odd and $(d-2)/2$ for d even. Therefore, $2\text{Tmax}=(d-1)-(d-1)\text{MODULO }2$. For more background information on error correction reference is made to "The Art of Digital Audio", J. Watkinson, Focal Press, London, 1988, chapter 7, pp. 201–247.

In digital cassette recorders (DCC) digital information is protected by way of error correction codes. Different Reed-Solomon codes are used for data channels and an auxiliary channel. A code word consists of 24 8-bit symbols. For the dam channels use is made of a product code composed of a C1 code (RS(24,20,5) over GF(256)) and a C2 code (RS(32,26,7) over GF(256)). For the auxiliary channel a single code RS(24,18,7) over GF(256) is used. All said codes can be decoded by the same erco circuit. The maximum number of errors that can be corrected for the code C1 is 2. In the correction strategy used for the code C2, it does not make sense to perform a correction for 3 errors. This would merely result in a negligibly small improvement of performance. However, it has been found useful to perform a correction for 3 errors for the auxiliary channel. The number of corrections to be executed for the auxiliary channel amounts to only a fraction of the number of corrections to be executed for the codes C1 and C2. Therefore, in this application ample correction time is available to execute the 3-error correction in accordance with the invention by repeatedly executing the 2-error correction. This will be described in detail hereinafter.

Figure 1:
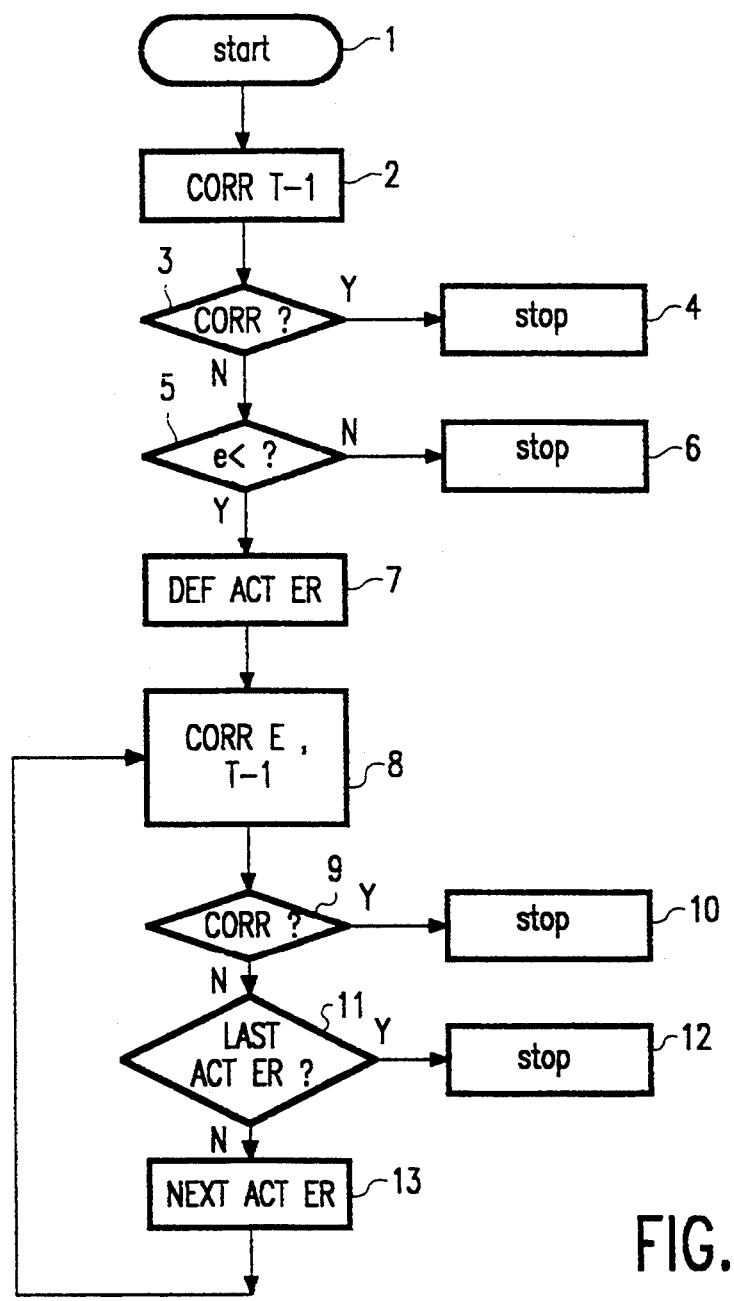
FIG. 1 shows a flow chart of a method in accordance with the invention.

FIG. 1 shows a flow chart of a method in accordance with the invention. The method utilizes known means (their input being the code word and erasure data, that is to say the number and the positions of the erasures in the code word) for the correction of at the most $T$ errors, the value of $T$ being smaller than or equal to $T_{max}$.

The method starts in block 1; the input at that instant is formed by the code word to be corrected and the erasures in this code word, i.e. the positions in the code word where incorrect symbols are present. In accordance with the invention, at the most $T$ errors per code word are corrected. When $T$ is smaller than $T_{max}$, the remaining parity symbols can be used, for example for an additional detection margin. In block 2 a correction step is executed by means of a known erco circuit for correcting at the most $T-1$ errors. Subsequently, in block 3 it is verified whether the correction step was successful. If so, the method proceeds to block 4: stop; evidently, the code word contained at the most $T-1$ errors which could all be corrected. If not, the method proceeds to block 5: verification whether the number of erasures (note that this number is already known in block 1) is smaller than or equal to $2(T_{max}-T)+(d-1)$ MODULO 2. Thus, for odd values of $d$ it is verified whether the number of erasures is smaller than or equal to $2(T_{max}-T)$; for even values of $d$ it is verified whether the number of erasures is smaller than or equal to $2(T_{max}-T)+1$. If not, the method proceeds to block 6: stop; evidently, the code word cannot be corrected, because $\{2T+e\} > \{2T+2(T_{max}-T)+(d-1) \text{ MODULO } 2\} = \{2T_{max}+(d-1) \text{ MODULO } 2\} = (d-1)$, so that it no longer holds that $2T+e<d$; in accordance with this method this error pattern cannot be corrected.

The following example is given for the purpose of illustration: assume that the minimum distance $d$ equals 9; in that case the largest number of errors that can be corrected in theory equals $T_{max}=4$. Assume that at the most $T=3$ errors need be corrected; the remaining parity symbols then serve, for example as an additional detection margin. In accordance with the method, at the most $T=3$ errors are corrected by means of an erco circuit which is suitable for the correction of at the most $T-1=2$ errors per code word. First a correction step for 2 errors is performed in block 2, after which it is checked in block 3 whether this correction step was successful. If so, the operation is finished: the code word contained at the most 2 errors and at the most 4 erasures. If not, in block 5 it is checked whether the number of erasures is smaller than or equal to $2(4-3)+0=2$. This is because in that case it makes sense to attempt a correction for 3 errors. When the number of erasures is greater than $2(T_{max}-T)+(d-1)$ MODULO 2, $2T+e>=d$, so that according to the method the code word cannot be corrected.

When the number of erasures is small enough, the method proceeds to block 7. A first symbol of the code word to be corrected is defined as a fictitious erasure. In that case a correction step is performed in block 8 by means of the means for correcting at the most $T-1$ errors, given the known erasures (evidently, this number may be zero) and the fictitious erasure. In block 9 it is verified whether the correction step was successful. If so, the method proceeds to block 10: stop; evidently, the code word T contained errors, one of which was located in the position of the fictitious erasure, so that the correction in accordance with the invention has been successful. If not, the method proceeds to block 11: verification whether all symbols of the code word have had their turn as a fictitious erasure. If so, the method proceeds to block 12: stop; evidently, the code word contained more than $T$ errors, so that it cannot be corrected in accordance with the method. If not, the method proceeds to block 13: define a next symbol of the code word to be corrected as a fictitious erasure. Proceed to block 8. A correction step for $T-1$ errors is thus repeatedly executed, each time with given erasures and a fictitious erasure.

The iteration can be terminated already before all symbols of the code word to be corrected have had their turn as a fictitious erasure: the last $T-1$ correction steps in the iteration are superfluous, because in the event of $T$ errors occurring at least one must already have been treated as a fictitious erasure before the last $T-1$ correction steps.

It is to be noted that, when the number of erasures is sufficiently small (block 5), it is also possible to define more than one fictitious erasure in the blocks 7 and 13, for example, each time two successive erasures. This offers the advantage that the number of iterations is then much smaller (substantially halved). A drawback could be that the risk of miscorrection increases. An example: for $d=7$, $T_{max}=3$, $T=3$, $e=0$ and two fictitious erasures, it may occur that four symbols are modified by a miscorrection during a correction step for at the most $T-1=2$ errors. An adequate step to solve this problem is to abstain from correction when the number of symbols to be modified is greater than $T$.

It is also to be noted that the first correction step in block 2 of the method shown in FIG. 1 will usually be successful, because the probability of $T$ errors will be much smaller than the probability of $T-1$ errors. Therefore, it is advantageous to attempt, like in FIG. 1, first a separate correction step for $T-1$ errors, before checking (block 5) whether it makes sense to attempt a correction for $T$ errors.

Figure 2:
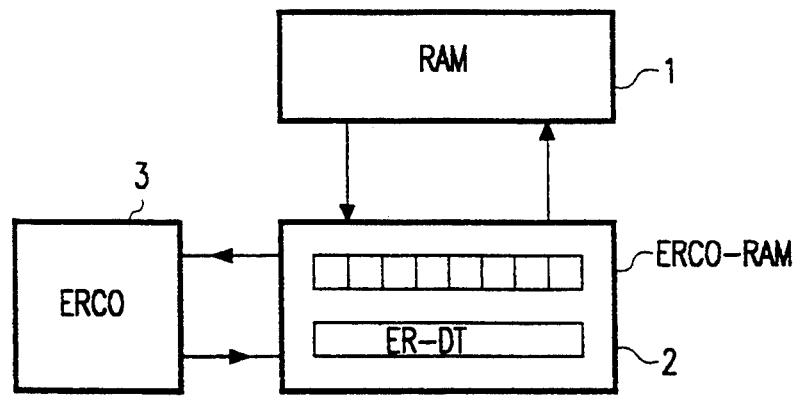
FIG. 2 shows an embodiment of a device in accordance with the invention.

FIG. 2 shows an embodiment of a device in accordance with the invention. An external memory 1 (for example, a RAM) contains a number of code words, each of which comprises, for example 24 symbols or bytes. The external memory 1 does not necessarily form part of the device in accordance with the invention. Under the control of a control unit (not shown), data can be exchanged with a memory 2, being the so-called erco-RAM. In the erco-RAM a code word to be corrected is stored and corrected. The corrected code word is returned to the external RAM. In the external RAM the symbols are provided with flags which are capable of assuming three different values. These flags can be represented by means of two additional bits. The following meaning is attached to the values of the flag bits:

2: the relevant symbol is an erasure;

1: the relevant symbol is not an erasure and forms part of a code word which has been found to contain at the most {2(Tmax−T)+(d−1)MODULO 2} erasures during a first correction step and which was uncorrectable thus far;

0: the relevant symbol is not an erasure and does not belong to a code word which has been found to contain at the most {2(Tmax−T)+(d−1)MODULO 2} erasures during a first correction step and which was uncorrectable thus far.

For initialization the value 0 can be assigned to all flags.

All symbols of a code word to be corrected are transferred from the external RAM to the erco-RAM. Per symbol an additional bit is available in the erco-RAM to memorize whether the relevant symbol is an erasure. This erasure data originates, for example from a alemodulator or (when a product code is used) from a decoder of a first code. Furthermore, in the erco-RAM it is also memorized whether symbols with a flag having the value 1 have arrived with a code word and whether the number of erasures in a code word is larger than {2(Tmax−T)+(d−1)MODULO 2}. After the complete code word has been written into the erco-RAM, a correction step is executed for T−1 errors. Subsequent to this step, the code word is returned to the external RAM, the values of the returned flags being dependent on the result of the most recent correction step, on whether symbols have arrived with a flag having the value 1, and on the number of erasures as will be described hereinafter.

If the code word was correctable, all constituent symbols obtain a flag having the value 0.

If the code word was not correctable, and no symbols having a flag of value 1 have arrived and the number of erasures is not larger than {2(Tmax−T)+(d−1)MODULO 2}, the first symbol is provided with a flag having the value 2 and the other symbols with a flag having the value 1.

If the code word was not correctable and no symbols having a flag of value 1 have arrived and the number of erasures is larger than {2(Tmax−T)+(d−1)MODULO 2}, all symbols are provided with a flag of value 2.

If the code word was not correctable and symbols having a flag of value 1 have arrived, all symbols are provided with a flag of value 1, except the symbol succeeding the symbol which was an erasure according to its relevant additional bit in the erco-RAM; this symbol is provided with a flag of value 2.

Under the control of the control unit, the device executes the above procedure 25 times (for a code word having a length of 24 symbols); the error correction in accordance with the invention has then been completed: the correction for T errors has been performed by way of means for correcting at the most T−1 errors. The result is:

if 2T+e<d, the correction has been successful and all symbols of the code word have been provided with a flag of value 0;

if 2T+e>=d and e<={2(Tmax−T)+(d−1)MODULO 2}, the error pattern cannot be corrected and all symbols of the code word have been provided with a flag of value 1;

if 2T+e>=d and e>{2(Tmax−T)+(d−1)MODULO 2}, the error pattern cannot be corrected and all symbols of the code word have been provided with a flag of value 2.

Epilogue

In the embodiment of the invention codes are considered which are systematic at the symbol level. This restriction is not necessary. The invention can also be used for codes where a yes/no distinction between data symbols and redundant symbols is not possible. The invention can furthermore be used notably for symbols comprising several bits, for example 2, 4 or 8 bits. The invention is particularly attractive when the same hardware is to decode several codes with different minimum distances defined over the same Galois field and having respective generator polynomials, a first generator polynomial being a factor of the second generator polynomial. This is because the generator polynomial can be written as an infinite product of factors, each factor defining a zero point of the polynomial. As a result, the second generator polynomial defines a sub-code of that defined by the first generator polynomial. On the other hand, the minimum distance between code words need not be uniform over the entire space of a given code. The advantage of the invention becomes apparent notably if the iterative trial method is required only for it comparatively small fraction of the code words. The described situation is a first example thereof in which the majority of the code words belong to a code with a comparatively small minimum distance whereas only a small fraction belongs to that with the larger minimum distance. Another example is that in most cases direct decoding produces full correction, the remaining cases representing merely a small remainder. The basic idea of the invention consists in that "imposing" an erasure enables calculation of an error symbol for the relevant erasure as well as, in addition, detection of the correctness, or not, of a correction to be performed by means of the relevant error symbol. Such detection may be based on two aspects: on the one hand, in addition to said correction there may be an additional detection possibility in that the minimum distance of the code is sufficient. Even when the minimum distance is completely "used up", additional detection may be certain or probable in the event of, for example a strongly reduced Reed-Solomon code as used in all cases described. This is because the length of a code word therein is always substantially smaller than 256 symbols. Maximum distance separable codes other than Reed-Solomon codes are also known per se. The invention can be used with externally presented erasures, in addition to the imposed erasures or not, for example external erasures originating from a previous digital processing step or a different detection. The trial method can be stopped either after all symbols have had their turn, or when suitable correction is detected. It is to be noted in this respect that an incorrect result can be obtained even in the case of an apparently correct correction. According to the iterative trial method, all symbols can be treated in a systematic sequence. It is also possible to grant priority to given symbols on the basis of an a priori higher probability of these symbols being "truly" incorrect, or to exclude given symbols because they have already been externally signalled to be erasures. In given cases the described operation at the symbol level can be combined with additional steps at the bit level, for example steps against single-bit errors. The method is preferably carried out in a device which is constructed as a consumer entertainment product in which the symbols represent at least partly a stream of audio and/or video information. Notably digital audio information is susceptible to errors which are experienced to be very annoying. Applications in this respect are, for example Compact Disc Audio and derivatives, and the Digital Compact Cassette (DCC) system.

I claim:

1. A digital-processor-implemented method for correcting at the most T symbol errors and symbol erasures in a code word composed of plural-bit symbols that has been encoded according to an error protection code with a predetermined symbol error correction capability of at the most T symbol errors, which method comprises the following steps:
   1. imposing an erasure indication for each symbol of a sub-set of the symbols;
   2. executing a complete error correction operation which is capable of correcting at the most T-1 symbol errors by means of said imposed erasure(s);
   3. verifying correctness of said complete error correction operation;
   4. repeating the steps 1, 2 and 3 for different sub-sets until either said verifying indicates said correctness or until all relevant sub-sets have been subjected to the steps 1, 2 and 3.

2. A method as claimed in claim 1, in which step 1 is preceded by: 0. execution of an initial correction operation on a number of symbols smaller than a maximum number corresponding to said correction capability, and detection of an incorrect result of said initial correction operation.

3. The method as claimed in claim 2, utilizing a device allowing for at most an error correction smaller than said correction capability.

4. A method as claimed in claim 2, also utilizing for said complete correction operation one or more externally presented erasures outside said sub-set.

5. A method as claimed in claim 1, utilizing a device allowing for at most an error correction smaller than said correction capability.

6. A method as claimed in claim 1, also utilizing for said complete correction operation one or more externally presented erasures outside said sub-set.

7. A device for correcting a code word composed of multi-bit symbols that has been encoded according to an error protection code having a predetermined symbol error correction capability of at the most T symbol errors, said device comprising:
   (a) means for receiving a code word;
   (b) means for receiving erasure data;
   (c) means for correcting at most T−1 errors in a code word, said means for correcting having sequencer means for
       in a first state executing an initial correction on a number of symbols that is smaller than the maximum number corresponding to said correction capability and of at the most T−1 symbol errors, and detecting of an incorrect result of said initial correction operation;
       in each of a string of successor states imposing an erasure indication for each symbol of a sub-set of symbols that is unique for the successor state in question, executing a complete error correction operation of at the most T−1 symbol errors by means of said imposed erasure(s), verifying correctness of this complete correction operation, and cycling through all successor states until either said verifying indicates said correctness or until all states of said string have been passed.

8. A device as claimed in claim 7, wherein all subsets are mutually exclusive.

9. A device as claimed in claim 8, for a code that is systematic at the symbol level.

10. A device as claimed in claim 7, for a code that is systematic at the symbol level.

11. A device as claimed in claim 10, which device is constructed as an apparatus for consumer entertainment, the symbols representing at least partly a stream of audio or video information.

12. A device as claimed in claim 7, which device is constructed as an apparatus for consumer entertainment, the symbols representing at least partly a stream of audio or video information.

13. A digital-processor-implemented method for correcting symbol errors and symbol erasures in a code word composed of plural-bit symbols that has been encoded according to an error protection code with a predetermined symbol error correction capability, which method comprises the following steps:
   1. imposing an erasure indication for each symbol of a sub-set of the symbols, each sub-set uniformly containing either one symbol or two symbols;
   2. executing a complete error correction operation by means of said imposed erasure(s);
   3. verifying correctness of said complete error correction operation;
   4. repeating the steps 1, 2 and 3 for different sub-sets until either said verifying indicates said correctness or until all relevant sub-sets have been subjected to the steps 1, 2 and 3.

14. The method as claimed in claim 13, utilizing a device allowing for at most an error correction smaller than said correction capability.

15. The method as claimed in claim 13, also utilizing for said complete correction operation one or more externally presented erasures outside said sub-set.

16. A device for correcting a code word composed of multi-bit symbols that has been encoded according to an error protection code having a predetermined symbol error correction capability, said device comprising:
   (a) means for receiving a code word;
   (b) means for receiving erasure data;
   (c) means for correcting at most T−1 errors in a code word, said means for correcting having sequencer means for
       in a first state executing an initial correction on a number of symbols that is smaller than the maximum number corresponding to said correction capability, and detecting of an incorrect result of said initial correction operation;
       in each of a string of successor states imposing an erasure indication for each symbol of a sub-set of symbols that is unique for the successor state in question, executing a complete error correction operation by means of said imposed erasure(s), verifying correctness of this complete correction operation, and cycling through all successor states until either said verifying indicates said correctness or until all states of said string have been passed;
   said code words being interspersed at relatively rare recurrence amongst second code words at relatively common recurrence, said second code words having been encoded according to a second error protection code with lower symbol error correction capability, for which only said first state is activated.

17. A digital-processor-implemented method for correcting symbol errors and symbol erasures in a code word composed of plural-bit symbols that has been encoded according to an error protection code with a predetermined symbol error correction capability, which method comprises the following steps:
1. executing an initial correction operation on a number of symbols smaller than a maximum number corresponding to said correction capability, and detection of an incorrect result of said initial correction operation;
2. imposing an erasure indication for each symbol of a sub-set of the symbols, each sub-set uniformly containing either one symbol or two symbols;
3. executing a complete error correction operation by means of said imposed erasure(s);
4. verifying correctness of said complete error correction operation;
5. repeating the steps 2, 3 and 4 for different sub-sets until either said verifying indicates said correctness or until all relevant sub-sets have been subjected to the steps 2, 3 and 4.

18. A device for correcting a code word composed of multi-bit symbols that has been encoded according to an error protection code having a predetermined symbol error correction capability, said device comprising:
(a) means for receiving a code word;
(b) means for receiving erasure data;
(c) means for correcting at most $T-1$ errors in a code word, said means for correcting having sequencer means for
 in a first state executing an initial correction on a number of symbols that is smaller than the maximum number corresponding to said correction capability, and detecting of an incorrect result of said initial correction operation;
 in each of a string of successor states imposing an erasure indication for each symbol of a sub-set of symbols that is unique for the successor state in question, executing a complete error correction operation by means of said imposed erasure(s), verifying correctness of this complete correction operation, and cycling through all successor states until either said verifying indicates said correctness or until all states of said string have been passed;
all of said subsets being mutually exclusive;
said code words being interspersed at relatively rare recurrence amongst second code words at relatively common recurrence, said second code words having been encoded according to a second error protection code with lower symbol error correction capability, for which only said first state is activated.

19. A device for correcting a code word composed of multi-bit symbols that has been encoded according to an error protection code having a predetermined symbol error correction capability, said device comprising:
(a) means for receiving a code word;
(b) means for receiving erasure data;
(c) means for correcting at most $T-1$ errors in a code word, said means for correcting having sequencer means for
 in a first state executing an initial correction on a number of symbols that is smaller than the maximum number corresponding to said correction capability, and detecting of an incorrect result of said initial correction operation;
 in each of a string of successor states imposing an erasure indication for each symbol of a sub-set of symbols that is unique for the successor state in question, executing a complete error correction operation by means of said imposed erasure(s), verifying correctness of this complete correction operation, and cycling through all successor states until either said verifying indicates said correctness or until all states of said string have been passed;
said code being systematic at the symbol level;
said code words being interspersed at relatively rare recurrence amongst second code words at relatively common recurrence, said second code words having been encoded according to a second error protection code with lower symbol error correction capability, for which only said first state is activated.

* * * * *